(12) United States Patent
Jiang et al.

(10) Patent No.: US 11,508,617 B2
(45) Date of Patent: Nov. 22, 2022

(54) METHOD OF FORMING INTERCONNECT FOR SEMICONDUCTOR DEVICE

(71) Applicant: Applied Materials, Inc., Santa Clara, CA (US)

(72) Inventors: Hao Jiang, San Jose, CA (US); Chi Lu, Sunnyvale, CA (US); He Ren, San Jose, CA (US); Chi-I Lang, Cupertino, CA (US); Ho-yung David Hwang, Cupertino, CA (US); Mehul Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 364 days.

(21) Appl. No.: 16/662,200

(22) Filed: Oct. 24, 2019

(65) Prior Publication Data
US 2021/0125864 A1 Apr. 29, 2021

(51) Int. Cl.
| H01L 21/768 | (2006.01) |
| H01L 21/027 | (2006.01) |
| H01L 21/3213 | (2006.01) |
| H01L 21/306 | (2006.01) |
| H01L 21/203 | (2006.01) |

(52) U.S. Cl.
CPC .... *H01L 21/76897* (2013.01); *H01L 21/0276* (2013.01); *H01L 21/203* (2013.01); *H01L 21/30621* (2013.01); *H01L 21/32135* (2013.01); *H01L 21/76834* (2013.01)

(58) Field of Classification Search
None
See application file for complete search history.

(56) References Cited

U.S. PATENT DOCUMENTS

| 4,536,951 A | * | 8/1985 | Rhodes | H01L 23/5226 438/669 |
| 4,954,423 A | * | 9/1990 | McMann | H01L 21/76897 430/318 |
| 4,960,489 A | * | 10/1990 | Roeska | H01L 21/76885 257/776 |
| 5,025,303 A | * | 6/1991 | Brighton | H01L 21/76885 257/E21.589 |
| 5,515,984 A | * | 5/1996 | Yokoyama | H01L 21/32136 216/75 |
| 6,027,860 A | * | 2/2000 | McClure | H01L 28/90 430/318 |

(Continued)

FOREIGN PATENT DOCUMENTS

| KR | 100699865 B1 | 3/2007 |
| WO | 2015094501 A1 | 6/2015 |

OTHER PUBLICATIONS

PCT International Search Report and Written Opinion in PCT/US2020/057136 dated Feb. 9, 2021, 9 pages.

(Continued)

*Primary Examiner* — Erik T. K. Peterson
(74) *Attorney, Agent, or Firm* — Servilla Whitney LLC

(57) ABSTRACT

A method of forming an interconnect structure for semiconductor devices is described. The method comprises etching a patterned interconnect stack for form first conductive lines and expose a top surface of a first etch stop layer; etching the first etch stop layer to form second conductive lines and expose a top surface of a barrier layer; and forming a self-aligned via.

7 Claims, 10 Drawing Sheets

(56) References Cited

U.S. PATENT DOCUMENTS

| | | | | |
|---|---|---|---|---|
| 6,057,081 | A * | 5/2000 | Yunogami | H01L 21/31144 216/41 |
| 6,133,635 | A * | 10/2000 | Bothra | H01L 23/5329 438/669 |
| 6,281,585 | B1 * | 8/2001 | Bothra | H01L 23/5226 257/788 |
| 6,399,508 | B1 * | 6/2002 | Ting | H01L 21/32136 438/720 |
| 6,432,835 | B1 * | 8/2002 | Yunogami | H01L 28/60 257/E21.009 |
| 6,433,436 | B1 * | 8/2002 | Feild | H01L 21/76897 257/773 |
| 6,692,903 | B2 * | 2/2004 | Chen | H01L 21/32136 430/329 |
| 6,984,585 | B2 * | 1/2006 | Ying | H01L 21/02071 257/E21.255 |
| 7,244,683 | B2 | 7/2007 | Chung et al. | |
| 7,320,942 | B2 * | 1/2008 | Chen | H01L 43/12 257/E21.256 |
| 7,365,005 | B1 | 4/2008 | Gadgil | |
| 7,732,314 | B1 | 6/2010 | Danek et al. | |
| 7,837,838 | B2 | 11/2010 | Chua et al. | |
| 7,955,979 | B2 | 6/2011 | Kostamo et al. | |
| 8,668,816 | B2 | 3/2014 | Ding et al. | |
| 9,390,909 | B2 | 7/2016 | Pasquale et al. | |
| 9,761,489 | B2 | 9/2017 | Mebarki et al. | |
| 10,770,308 | B2 * | 9/2020 | Tahara | H01L 21/67248 |
| 2001/0049181 | A1 | 12/2001 | Rathi et al. | |
| 2002/0016085 | A1 | 2/2002 | Huang et al. | |
| 2002/0076925 | A1 | 6/2002 | Marieb et al. | |
| 2002/0117758 | A1 | 8/2002 | Mukherjee et al. | |
| 2002/0155693 | A1 * | 10/2002 | Hong | H01L 21/76885 438/618 |
| 2003/0000844 | A1 | 1/2003 | Carl et al. | |
| 2003/0020176 | A1 * | 1/2003 | Nambu | H01L 21/76801 257/774 |
| 2003/0027427 | A1 | 2/2003 | Ma et al. | |
| 2003/0180968 | A1 * | 9/2003 | Nallan | H01L 43/12 257/E43.006 |
| 2003/0232495 | A1 | 12/2003 | Moghadam et al. | |
| 2004/0046260 | A1 | 3/2004 | Huang et al. | |
| 2004/0124438 | A1 | 7/2004 | Mukherjee et al. | |
| 2004/0131878 | A1 | 7/2004 | Seet et al. | |
| 2005/0176237 | A1 * | 8/2005 | Standaert | H01L 21/76802 438/622 |
| 2011/0117749 | A1 * | 5/2011 | Sheu | H01J 37/32935 438/735 |
| 2011/0306215 | A1 * | 12/2011 | Ding | H01L 21/02057 438/720 |
| 2013/0087447 | A1 | 4/2013 | Bodke et al. | |
| 2014/0239246 | A1 | 8/2014 | Noda | |
| 2014/0273430 | A1 * | 9/2014 | Naik | H01L 23/5329 438/613 |
| 2015/0056800 | A1 * | 2/2015 | Mebarki | H01L 21/32139 438/666 |
| 2016/0099174 | A1 * | 4/2016 | Wu | H01L 21/76811 438/618 |
| 2016/0197011 | A1 | 7/2016 | Bristol et al. | |
| 2016/0336178 | A1 | 11/2016 | Swaminathan et al. | |
| 2017/0033004 | A1 | 2/2017 | Siew et al. | |
| 2017/0047290 | A1 * | 2/2017 | Singh | H01L 21/31111 |
| 2018/0158694 | A1 | 6/2018 | Lin et al. | |
| 2019/0067089 | A1 * | 2/2019 | Yang | H01L 23/5226 |
| 2019/0172716 | A1 | 6/2019 | Graoui et al. | |
| 2020/0027782 | A1 * | 1/2020 | Jiang | H01J 37/32935 |
| 2020/0135459 | A1 * | 4/2020 | Jiang | H01L 21/67103 |
| 2020/0303252 | A1 * | 9/2020 | Zhang | H01L 21/31138 |
| 2020/0350206 | A1 * | 11/2020 | Ren | H01L 21/76897 |
| 2021/0082804 | A1 * | 3/2021 | Wu | H01L 21/76897 |
| 2021/0098293 | A1 * | 4/2021 | van der Straten | H01L 23/5226 |

OTHER PUBLICATIONS

PCT International Search Report and Written Opinion in PCT/US2020/057142 dated Feb. 10, 2021, 9 pages.

Non-Final Office Action in U.S. Appl. No. 161751,691, dated Jun. 24, 2021, 8 pages.

* cited by examiner

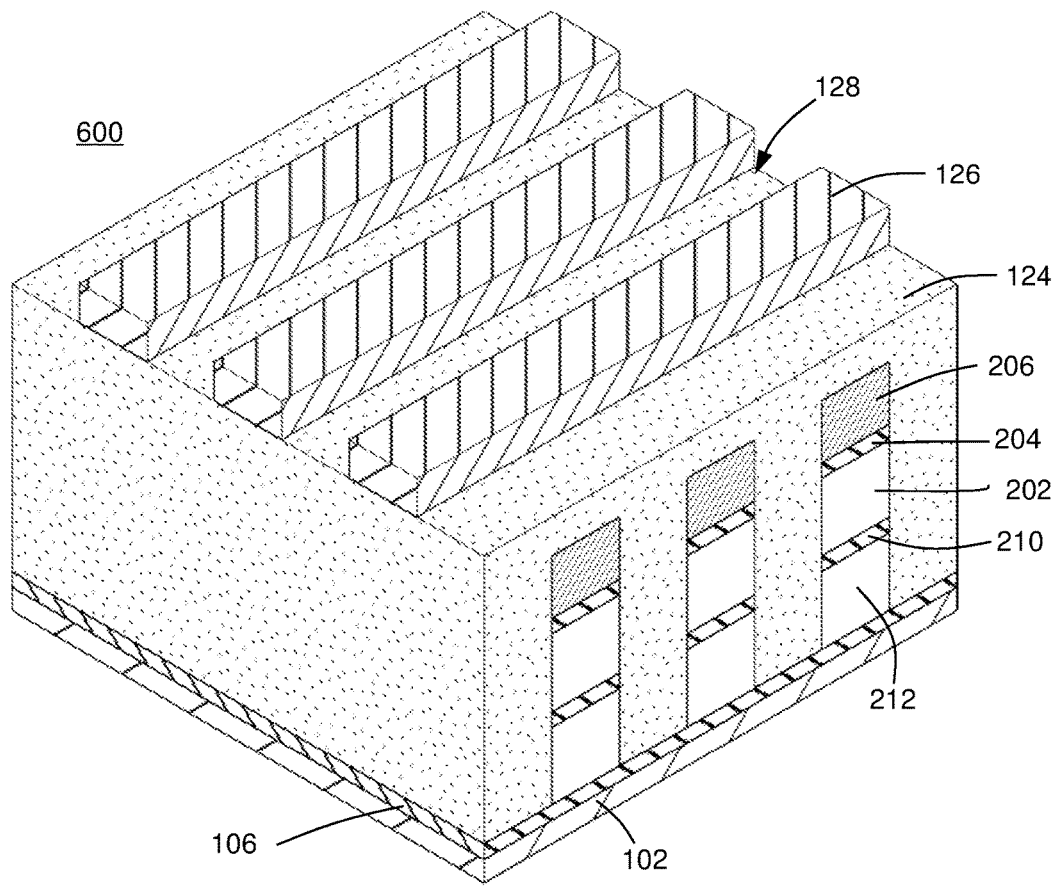
FIG. 6
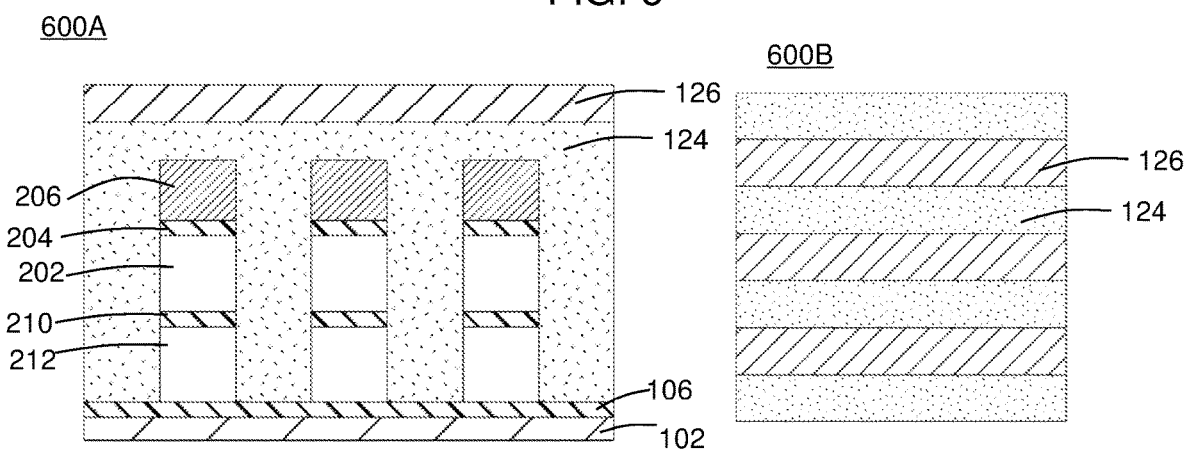
FIG. 6A
FIG. 6B

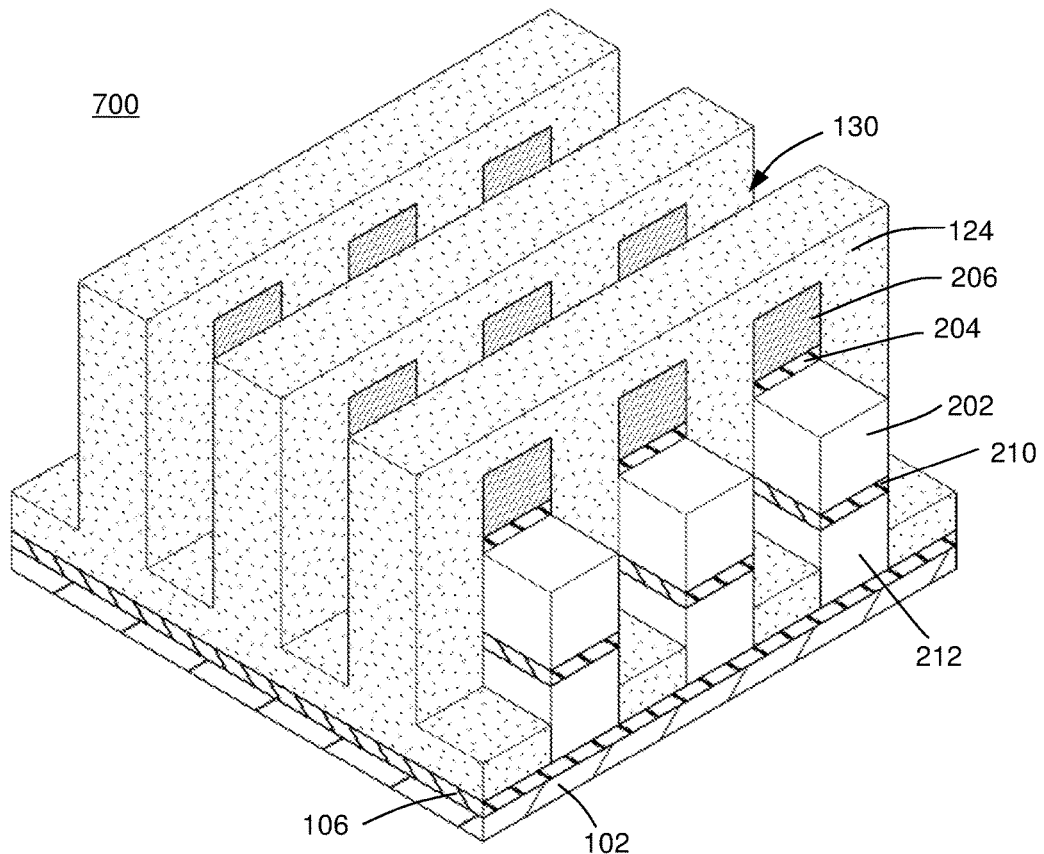
FIG. 7
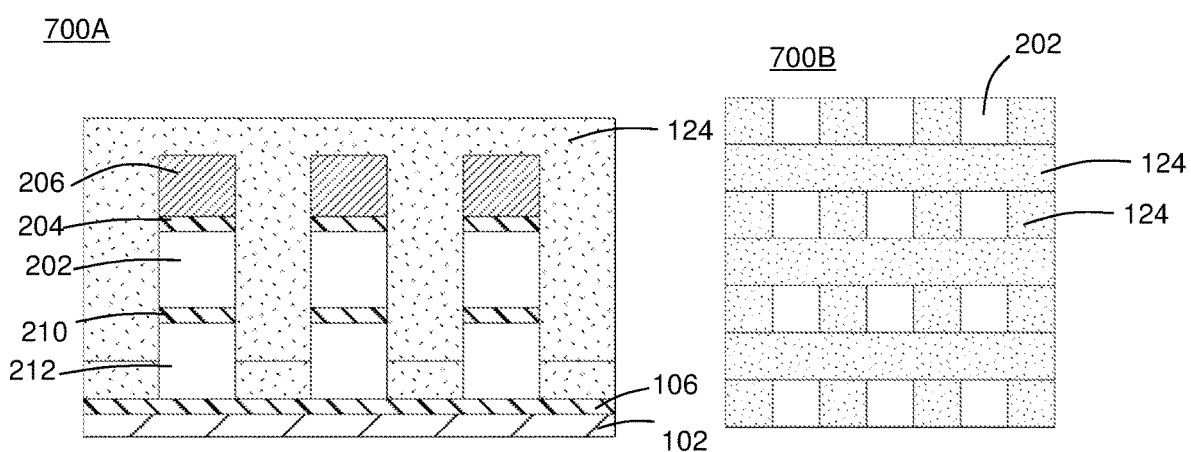
FIG. 7A
FIG. 7B

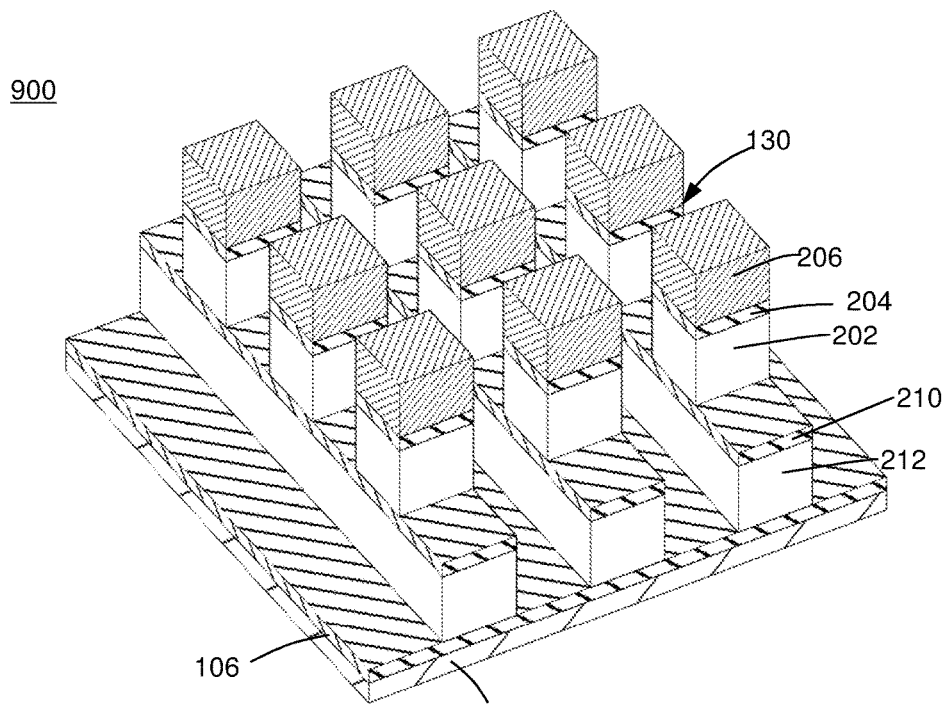
FIG. 9
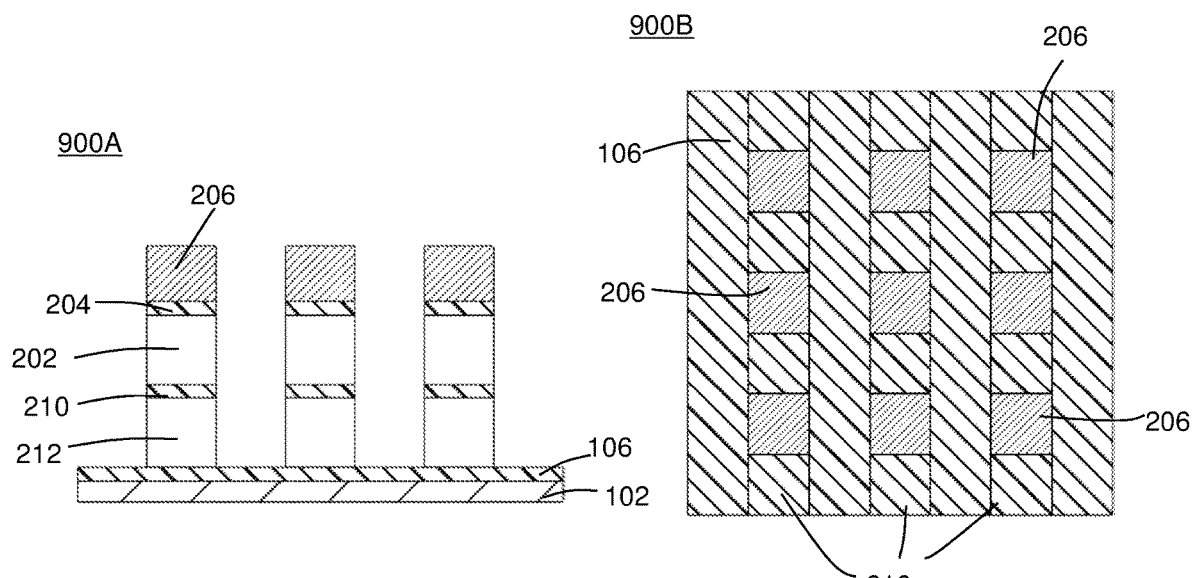
FIG. 9A
FIG. 9B

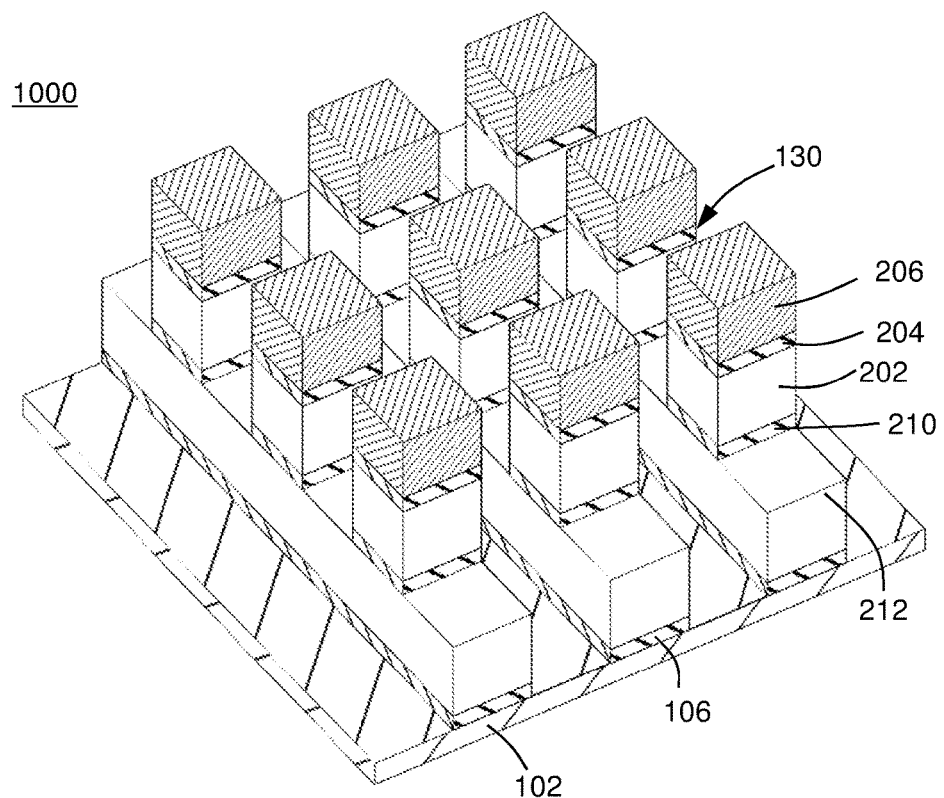
FIG. 10
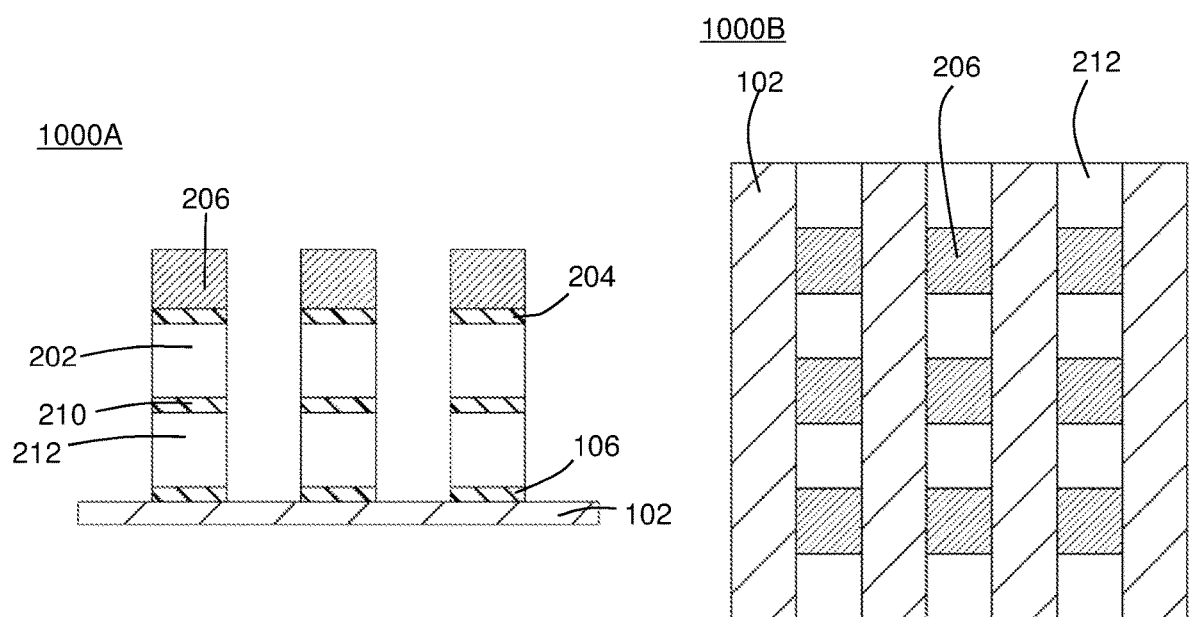
FIG. 10A
FIG. 10B

METHOD OF FORMING INTERCONNECT FOR SEMICONDUCTOR DEVICE

TECHNICAL FIELD

Embodiments of the present disclosure pertain to the field of interconnect structures and interconnect structure manufacturing. More particularly, embodiments of the disclosure provide methods for creating interconnect structures with aligned vias and/or contacts using a subtractive process.

BACKGROUND

Interconnect structures, such as personal computers, workstations, computer servers, mainframes and other computer related equipment such as printers, scanners and hard disk drives use logic and memory devices that provide substantial data storage capability and capacity, while incurring low power consumption. The scaling of features has been a driving force behind an ever growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

On-chip electrical interconnections have previously been produced using "dual-damascene" fabrication techniques in which apertures are created through various layers of the device structure, and the apertures are filled with a conductive material to form the interconnects between layers and between device features located on individual layers. Dual-damascene can allow formation of vias (Vx) that are self-aligned with the above metal line (Mx). For chips which are based on 10 nm Node and smaller feature sizes, however, there are gap fill and resistivity constraints which make it impractical to use the "dual-damascene" fabrication techniques which have previously been relied upon.

Accordingly, there is a need for a processing method that does not use the damascene scheme while still allowing alignment of vias to the above or underlying metal lines.

SUMMARY

One or more embodiments of the disclosure are directed to a method of forming an interconnect structure. In one or more embodiments, the method comprises: etching a patterned interconnect stack for form first conductive lines and expose a top surface of a first etch stop layer; etching the first etch stop layer to form second conductive lines and expose a top surface of a barrier layer; and forming a self-aligned via.

Additional embodiments of the disclosure are directed to a method of forming an interconnect structure, the method comprising: forming a conformal first metal layer on a barrier layer on a substrate; forming a first etch stop layer on the first metal layer; forming a second metal layer on the first etch stop layer; forming a second etch stop layer on the second metal layer; forming a lithographic patterning structure over a top surface of the second etch stop layer; etching the lithographic patterning structure for form first conductive lines and expose a top surface of a first etch stop layer; etching the first etch stop layer to form second conductive lines and expose a top surface of the barrier layer; forming a second lithographic patterning structure over a top surface of the first conductive lines and second conductive lines; etching the second lithographic patterning structure to expose an upper surface of the first conductive lines; etching the second lithographic patterning structure to expose an upper surface of the first etch stop layer; removing the second lithographic patterning structure to form a self-aligned via; and etching the first etch stop layer and the barrier layer.

Further embodiments of the disclosure are directed to a method of forming an interconnect structure. In one or more embodiments, the method comprises: patterning an interconnect stack, the interconnect stack comprising a substrate having a barrier layer thereon, a ruthenium layer on the barrier layer, a titanium nitride (TiN) layer on the ruthenium layer, a second ruthenium layer on the titanium nitride (TiN) layer, a second etch stop layer on the second ruthenium layer, a silicon oxide layer on the second etch stop layer, a spin-on dielectric material on the silicon oxide layer, and a patterned photoresist on the spin-on dielectric material; etching the patterned interconnect stack for form first conductive lines and expose a top surface of the titanium nitride (TiN) layer; etching the first etch stop layer to form second conductive lines and expose a top surface of the barrier layer; and forming a self-aligned via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 illustrates an isometric view of an interconnect structure according to one or more embodiment of the disclosure;

FIG. 6A illustrates a cross-section view of the interconnect structure of FIG. 6 according to one or more embodiments;

FIG. 6B illustrates a top view of the interconnect structure of FIG. 6 according to one or more embodiments;

FIG. 7 illustrates an isometric view of an interconnect structure according to one or more embodiment of the disclosure;

FIG. 7A illustrates a cross-section view of the interconnect structure of FIG. 7 according to one or more embodiments;

FIG. 7B illustrates a top view of the interconnect structure of FIG. 7 according to one or more embodiments;

FIG. 9 illustrates an isometric view of an interconnect structure according to one or more embodiment of the disclosure;

FIG. 9A illustrates cross-section view of the interconnect structure of FIG. 9 according to one or more embodiments;

FIG. 9B illustrates a top view of the interconnect structure of FIG. 9 according to one or more embodiments;

FIG. 10 illustrates an isometric view of an interconnect structure according to one or more embodiment of the disclosure;

FIG. 10A illustrates a cross-section view of the interconnect structure of FIG. 10 according to one or more embodiments;

FIG. 10B illustrates a top view of the interconnect structure of FIG. 10 according to one or more embodiments.

DETAILED DESCRIPTION

Figure 1:
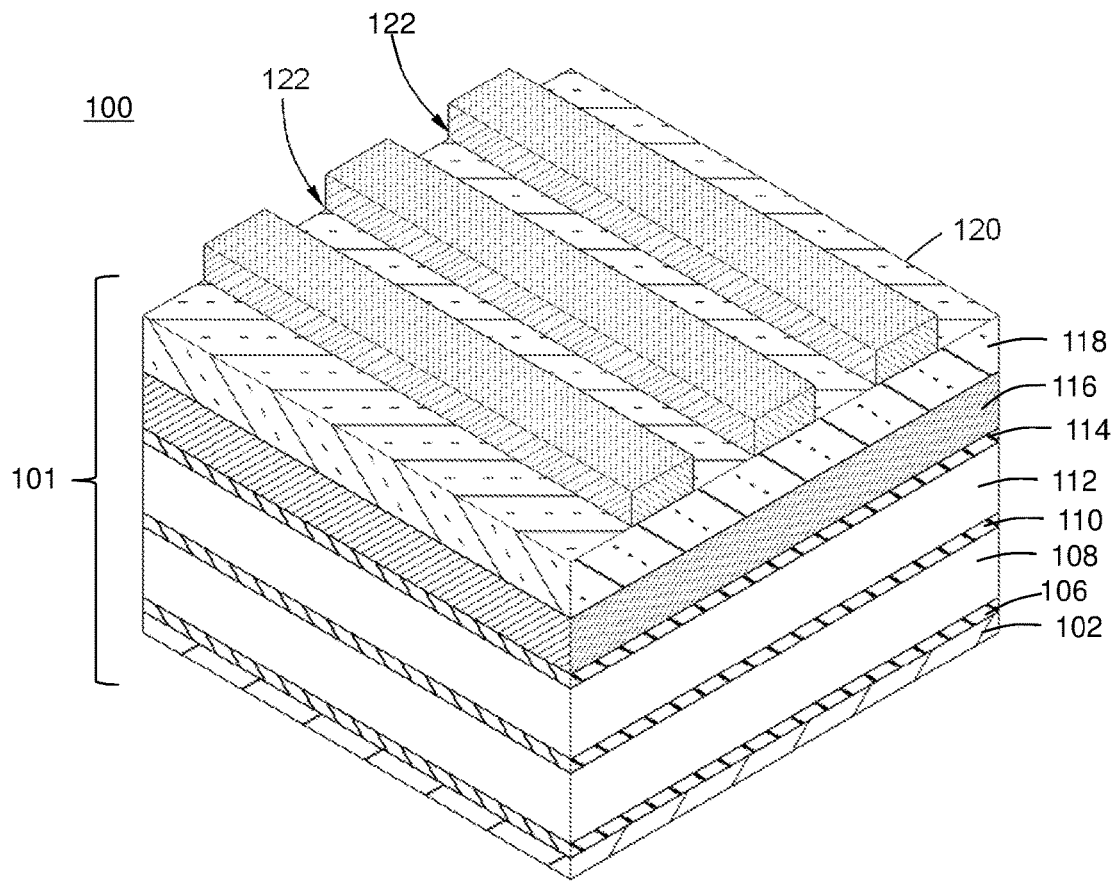
FIG. 1 illustrates an isometric view of an interconnect structure according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

One or more embodiments of the disclosure advantageously provide methods that enable vias to be aligned (relative to the bottom line) based on a subtractive scheme. Embodiments of the self-aligned subtractive scheme allow for formation of an interconnect structure with or without a metal barrier layer/liner. Some embodiments advantageously provide self-alignment of the via.

The present method provides self-aligned interconnect structures for use in combination with semiconductor devices without the use of vias which are filled with contact material. Instead, all contact materials are deposited in conformal layers, so that no filling of any micro conduits with conductive material is required. Subsequently, a pattern is dry etched through a stack of layers which includes the layers of contact materials, so that pillars of contact material extend upward to provide interconnects extending from an underlying base layer which contains contacts which mate with surfaces on a semiconductor device. The pillars of contact material are typically metal, but may be doped ceramic compositions or conductive polymeric materials capable of transferring electrical current. It is also understood that the interconnect structures which are produced need not be in the form of vertical pillars, but may be in other shapes which may be processed from a stack of conformal layers using subtractive techniques.

The description below refers to the creation of metal pillars, because this is likely to be a frequently used form of the self-aligned interconnect structures; however, there is no intent to limit the embodiments to one form of a conductive path which comprises metals, doped ceramic compositions, or may be doped or un-doped conductive polymeric materials to provide the interconnect paths. It is intended that when a "metal" is referred to in the descriptions of the structures below, it is understood that other conductive materials which may be applied in the form of a conformal layer are also intended to be included.

Embodiments of the disclosure create an interconnect structure which includes the deposition of multiple layers of materials, followed by the use of subtractive techniques such as the dry etch techniques or Atomic Layer Etch (ALE). In one or more embodiments, the conductive interconnect structures formed are surrounded by dielectric materials as necessary.

Examples of dry etch processes which have been used for etching of gate structures and which may be used for dry etching of interconnect structures, according to one or more embodiments, where some fine tuning may be required to achieve etching accuracy down to the 5 nm Node include the SiCoN dry etch process of Applied Materials, Inc., Santa Clara, Calif., which is particularly useful for etching silicon or nitrogen containing materials such as silicon oxide or silicon nitride, or siliconoxynitride, for example and not by way of limitation, or the SYM3® Etch chamber of Applied Materials, Inc. Santa Clara, Calif., which is particularly useful for etching conductor materials including, but not limited to, titanium nitride (TiN), tantalum nitride (TaN), ruthenium (Ru), molybdenum (Mo), and the like.

By using a stack of varying layers which include line metal; etch stop material layers having a relatively high conductivity component (in the form of metal or doped ceramic or polymeric material); and, pattern transfer layers which make up a lithography stack (typically including a hard masking material); and by applying subtractive techniques to form desired structures within the stack, it is possible to form interconnect conduits in the form of pillars, for example, without the need to fill a tiny capillary with a fluid conductive material. The method of forming an interconnect structure which is described above makes it possible to progress to devices at the 10 nm Node and below.

One or more embodiments advantageously provide a method of forming an interconnect structure, wherein at least one subtractive process is used to form the interconnect structure, so that electrical contacts, typically in the form of pillars, are self-aligned relative to underlying line contacts. In one or more embodiments, the contact pillars are solid, and without the presence of voids.

One or more embodiments advantageously provide an integrated etch process. In one or more embodiments, a high etch rate metal etch to etch top metal layer is used to minimize hard mask (HM) sputtering. In one or more embodiments, the etch stop layer (ESL) is opened by pulsing dry etch to allow residual/by-product flow out. In one or more embodiments, a passivation metal etch process to the bottom (or first) metal layer achieves a straight profile in both layer of metals. In one or more embodiments, a passivation metal etch process is achieved by sputtering a high amount of hardmask material to a metal sidewall, as a passivation layer.

Figure 1A:
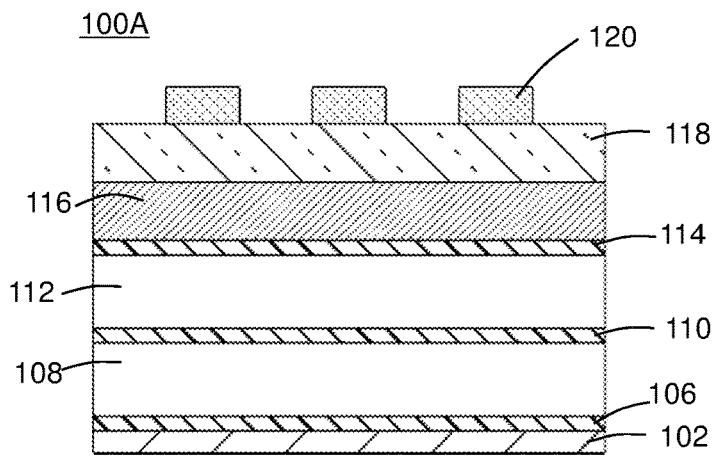
FIG. 1A illustrates a cross-section view of the interconnect structure of FIG. 1 according to one or more embodiments.
Figure 1B:
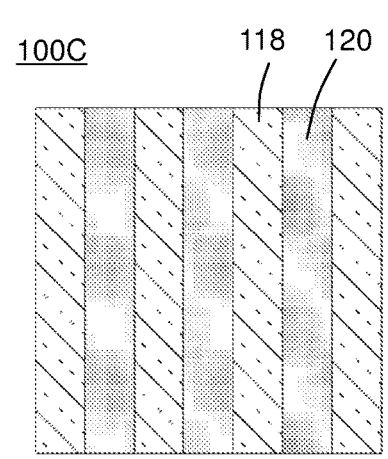
FIG. 1B illustrates a top view of the interconnect structure of FIG. 1 according to one or more embodiments.

FIG. 1 shows an isometric, three-dimensional view 100 of an exemplary starting "stack" 101 of layers to be used to form an interconnect structure. FIG. 1A illustrates a cross-section view 100A of the device illustrated in FIG. 1. FIG. 1B is a top view 100B of the interconnect structure illustrated in FIG. 1. The skilled artisan will recognize that the exemplified "stack" 101 is merely one possible configuration and should not be taken as limiting the scope of the disclosure.

The substrate can be any suitable material as described herein. For descriptive purposes only, the substrate 102 will be discussed as a silicon substrate. In one or more embodiments, the substrate 102 represents a structure which is contacted with an underlying semiconductor structure to connect the interconnect structure with an underlying semiconductor device. The substrate 102 may be a tungsten plug if connected to a FEOL (front end of line) device such as a transistor, capacitor, or resistor, for example; or, the substrate 102 may be copper or other conductive plug material if an interconnect is required.

The illustrated embodiment includes an optional barrier layer 106. In one or more embodiments, the barrier layer 106 comprises a liner. In one or more embodiments, the barrier layer 106 can also be omitted from the stack. For example, if the first metal layer 108 has good adhesion to the substrate 102, then the optional barrier layer 106 may be superfluous. The optional barrier layer 106 can be any suitable material that can increase adhesion of the first metal layer 108 to the substrate 102. In one or more embodiments, the barrier layer 106 comprises on or more of tantalum (Ta), titanium (Ti), tantalum nitride (TaN), titanium nitride (TiN), or tantalum/tantalum nitride (Ta/TaN). The optional barrier layer 106 can be deposited by any suitable technique known to the skilled artisan including, but not limited to, atomic layer deposition (ALD), chemical vapor deposition (CVD), physical vapor deposition (PVD), evaporation or plating.

In one or more embodiments, the first metal (conductive) layer 108 is on the optional barrier layer 106; or on the substrate 102 if the optional barrier layer 106 is omitted. In one or more embodiments, the barrier layer 106 comprises a liner. The first metal layer 108 can be any suitable layer deposited by any suitable technique known to the skilled artisan. In one or more embodiments, the first metal layer 108 is deposited using a technique selected from CVD, PVD, ALD, deposition from an evaporated source of metal, or metal plating. In some embodiments, the first metal layer 108 is a conformal layer of material selected from metals such as tungsten (W), cobalt (Co), ruthenium (Ru), molybdenum (Mo), aluminum (Al), copper (Cu), silicide, graphene, or combinations thereof, for example and not by way of limitation. In one or more embodiments, the first metal layer comprises ruthenium (Ru).

In one or more embodiments, a first etch stop layer 110, which is also a conductor layer, overlies the first metal layer 108. In some embodiments, the first etch stop layer 110 is absent. The first etch stop layer 110 can be any suitable material, including, but not limited to a conformal layer of tantalum (Ta), tantalum nitride (TaN), titanium (Ti), titanium nitride (TiN), W, Co, Ru, niobium (Nb), niobium nitride (NbN), and combinations thereof, which are deposited using a technique selected from CVD, PVD, ALD, deposition from an evaporated source of metal, metal plating, or may be an oxide of Ti, which is doped with a dopant such as a silicide.

A second metal layer 112 is formed on the first etch stop layer 110. The second metal layer 112 may (but need not be) the same as the first metal layer 108 described above. In one or more embodiments, the second metal layer 112 comprises a pillar-forming metal. In some embodiments, the pillar-forming metal is selected from one or more of tungsten (W), cobalt (Co), ruthenium (Ru), molybdenum (Mo), aluminum (Al), copper (Cu), silicide, graphene, or combinations thereof, for example and not by way of limitation. In one or more embodiments, the second metal layer 112 comprises ruthenium (Ru).

In one or more embodiments, the first etch stop layer 110 is for etch stop of the second metal layer 112. In one or more embodiments, the second metal layer 112 comprises ruthenium (Ru), and the first etch stop layer 110 comprises one or more of titanium, tantalum, titanium nitride (TiN), tantalum nitride (TaN), tungsten (W), molybdenum (Mo), or the like. In one or more embodiments, when the first metal layer 108 and second metal layer 112 are different materials and have high etch selectivity to etch other, the first etch stop layer 110 is omitted.

In one or more embodiments, a second etch stop layer 114 overlies the second metal layer 112. In one or more embodiments, the second etch stop layer 114 composition may be (but need not be) the same as the first etch stop layer 110. In one or more embodiments, having the first etch stop layer 110 and second etch stop layer 114 as the same material simplifies processing. In one or more embodiments, the second etch stop layer 114 can be any suitable material, including, but not limited to a conformal layer of tantalum (Ta), tantalum nitride (TaN), titanium (Ti), titanium nitride (TiN), W, Co, Ru, niobium (Nb), niobium nitride (NbN), and combinations thereof, which are deposited using a technique selected from CVD, PVD, ALD, deposition from an evaporated source of metal, metal plating, or may be an oxide of titanium (Ti), which is doped with a dopant such as a silicide.

In one or more embodiments, the second etch stop layer 114 is for etch stop of the hard mask layer 116. In one or more embodiments, the hard mask layer 116 comprises silicon oxide, and the second etch stop layer 114 comprises one or more of titanium (Ti), tantalum (Ta), titanium nitride (TiN), tantalum nitride (TaN), silicon nitride (SiN), silicon carbonitride (SiCN), silicon oxynitride (SiON), or the like. In one or more embodiments, the second etch stop layer 114 is omitted, is not present. In some embodiments, when the etch chemicals for hard mask layer 116 do not impact the second metal layer 112, such as, for example, when hard mask layer 116 comprises silicon oxide (SiO) and second metal layer 112 comprises ruthenium, the second etch stop layer 114 is not present.

In one or more embodiments, a hard mask layer 116 overlies the second etch stop layer 114. In one or more embodiments, the hard mask layer is used in combination with an overlying "lithography stack" to transfer a device pattern through underlying layers 114, 112, 110, and 108 which are described above. In one or more embodiments, the hard mask layer 116 is a single layer. In other embodiments, the hard mask layer 116 is a combination of layers. The hard mask layer 116 is not described herein, but, in one or more embodiments, is fabricated using materials and patterning techniques which are known in the art as being capable of providing a pattern at a 10 nm Node (16 nm HPCD) or lower. In some embodiments, the hard mask layer 116 comprises a metallic or dielectric mask material. Suitable dielectric materials include, but are not limited to, silicon oxide (SiO), silicon nitride (SiN), silicon carbide (SiC), aluminum oxide (AlOx), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film.

In one or more embodiments, a bottom anti-reflective coating (BARC) 118 and photoresist 120 are formed thereon. The photoresist 120 illustrated is patterned with trenches 122; however, the pattern can be any suitable shape or combination of shapes.

In one or more embodiments, the combination of the hard mask layer 116, the bottom anti-reflective coating (BARC) 118, and the photoresist 120 are herein referred to the first "lithographic patterning structure."

Figure 2:
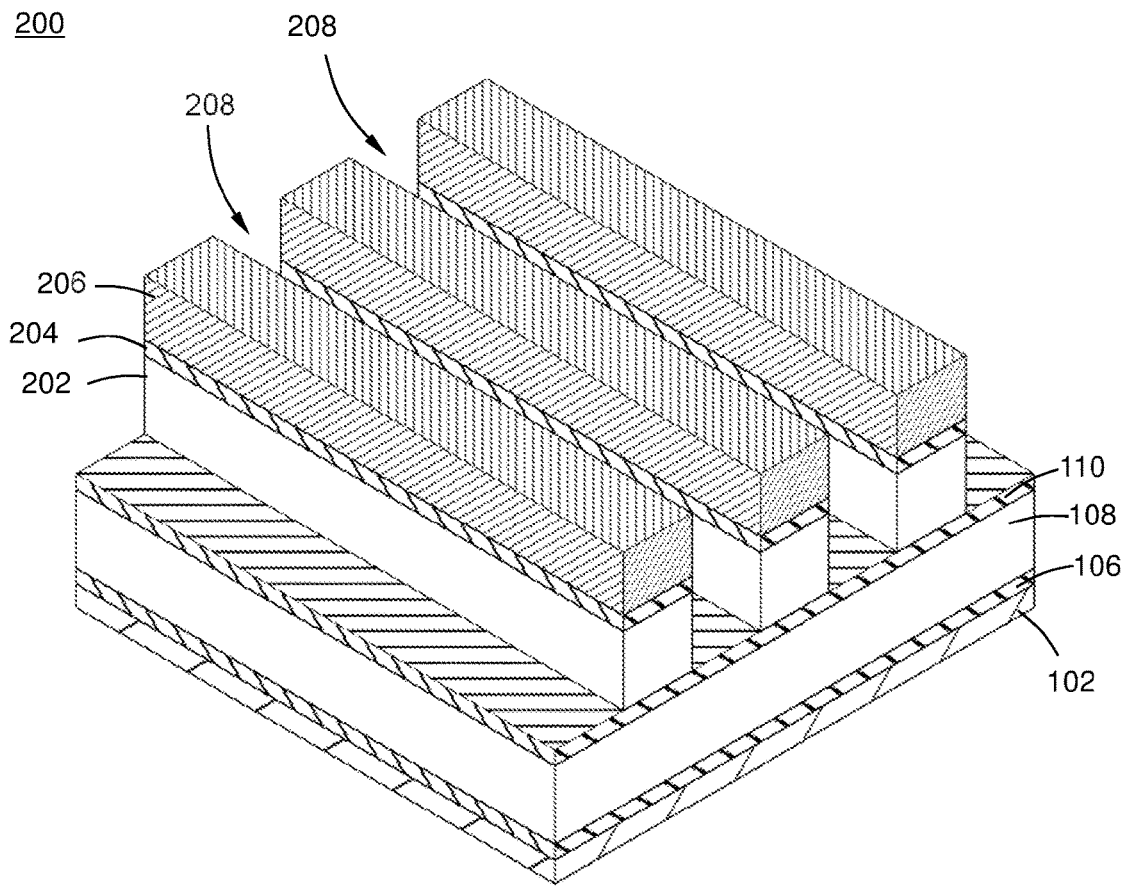
FIG. 2 illustrates an isometric view of an interconnect structure according to one or more embodiment of the disclosure.
Figure 2A:
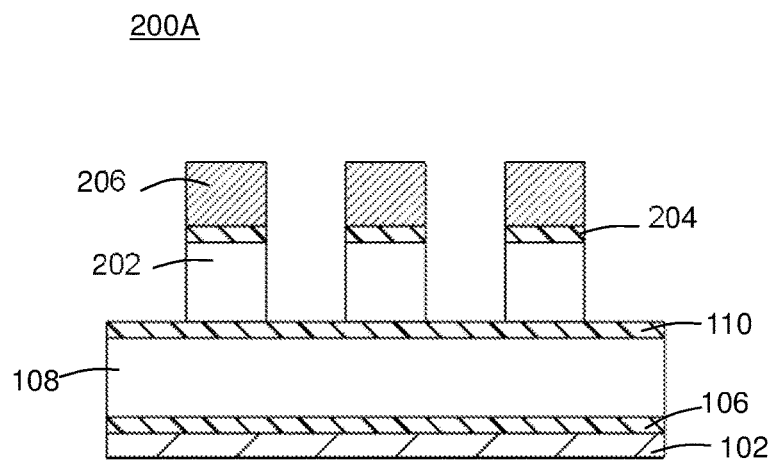
FIG. 2A illustrates a cross-section view of the interconnect structure of FIG. 2 according to one or more embodiments.
Figure 2B:
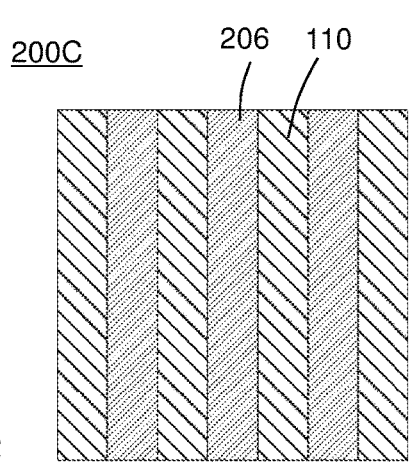
FIG. 2B illustrates a top view of the interconnect structure of FIG. 2 according to one or more embodiments.

FIG. 2 illustrates an isometric view 200 of a partially patterned structure formed from the starting stack 101 illustrated in FIG. 1. FIG. 2A illustrates a cross-section view 200A of the structure illustrated in FIG. 2. FIG. 2B is a top view 200B of the structure illustrated in FIG. 2. In one or more embodiments, the second metal layer 112 is etched in a first direction to the top surface of first etch stop layer 110, to create upwardly extending first conductive lines 202 above the first etch stop layer 110. In one or more embodiments, forming the first conductive lines 202 comprises exposing the patterned interconnect stack 101 to an etch gas and etching the patterned interconnect stack with a high etch rate. In one or more embodiments, the second metal layer 112 is etched with a high rate in a range of about 0.5 nm/s to about 5 nm/s, including about 1 nm/s, about 1.5 nm/s, about 2 nm/s, about 2.5 nm/s, about 3 nm/s, about 3.5 nm/s, about 4 nm/s, about 4.5 nm/s, or about 5 nm/s, for a period of time in the range of about 10 seconds to about 100 seconds, including about 10 seconds to about 80 seconds, about 20 seconds to about 90 seconds, or about 10 seconds to about 60 seconds. Without intending to be bound by theory, it is thought that the combination of the high etch rate for a short period of time minimizes sputter of the hard mask layer 116. In one or more embodiments, the second metal layer 112 comprises ruthenium (Ru) and is etched in a SYM3® Etch chamber of Applied Materials, Inc. Santa Clara, Calif., SCLA etc. In one or more embodiments, the source power is in the range of about 500 Watts (W) to about 1800 W, the bias power is in a range of about 50 W to about 300 W, the bias power pulsing duty cycle is in the range about 15% to about 90%, the pressure is in the range of about 5 mTorr to about 50 mTorr, the electrostatic chuck temperature is in the range of about 30° C. to about 90° C., the gas flow of oxygen is in the range of about 100 sccm to about 700 sccm, and the gas flow of chlorine is in the range of about 20 sccm to 100 sccm.

In one or more embodiments, overlying the conductive lines 202 formed from the second metal layer 112 are lines 204 of the second etch stop layer 114, and lines 206 of hard mask layer 116. In one or more embodiments, the conductive lines 202 are formed from a metal, and that metal is one which provides the effective resistivity dictated by the node size of the semiconductor structure. In one or more embodiments, trenches 208 separate rows of second metal layer 112, which will be further processed to become conductive interconnect contacts.

Figure 3:
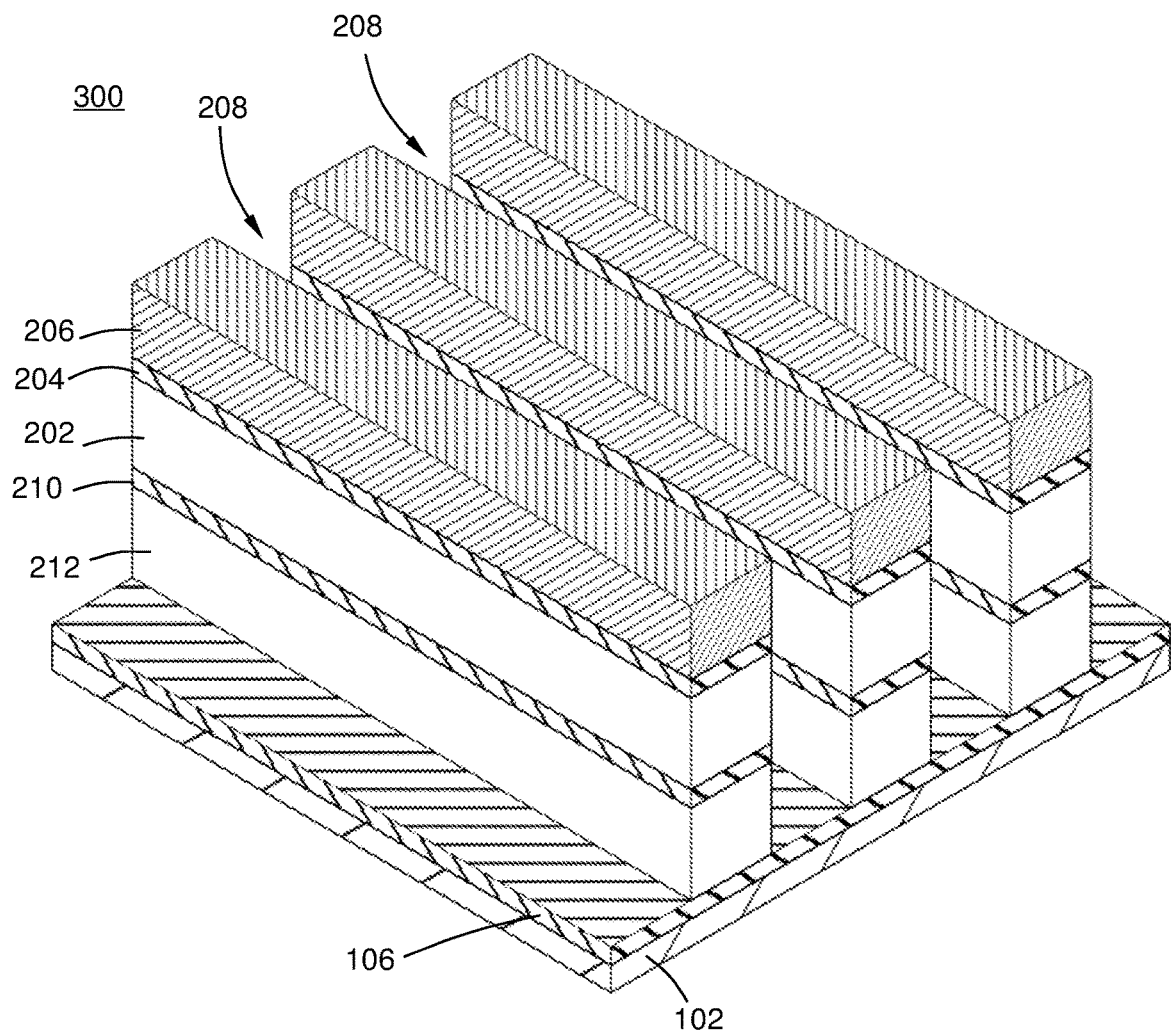
FIG. 3 illustrates an isometric view of an interconnect structure according to one or more embodiment of the disclosure.
Figure 3A:
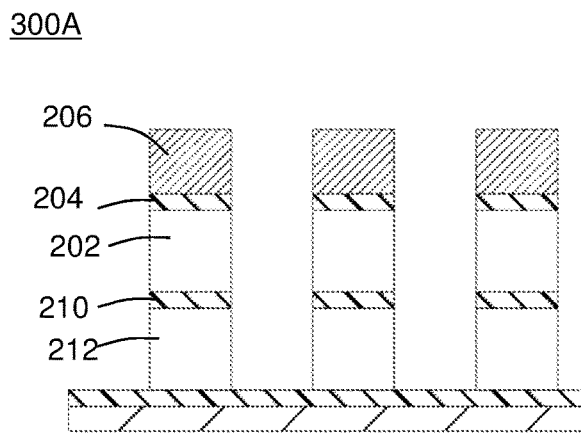
FIG. 3A illustrates a cross-section view of the interconnect structure of FIG. 3 according to one or more embodiments.
Figure 3B:
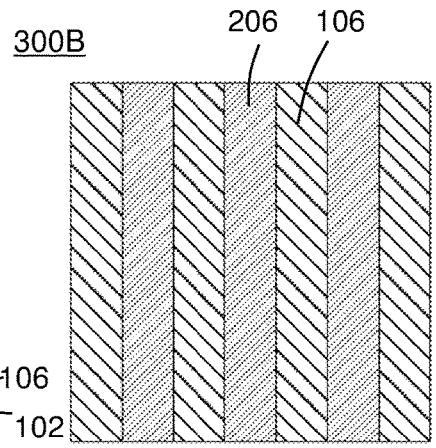
FIG. 3B illustrates a top view of the interconnect structure of FIG. 3 according to one or more embodiments.

FIG. 3 illustrates an isometric, three-dimensional view 300 of the partially patterned structure shown in FIG. 2 after the removal of the patterning stack. FIG. 3A illustrates a cross-section view 300A of the structure illustrated in FIG. 3. FIG. 3B is a top view 300B of the structure illustrated in FIG. 3. In one or more embodiments, the first etch stop layer 110 is etched to the top surface of the first metal layer 108, and the first metal layer 108 is then etched form second conductive lines 212 above the optional barrier layer 106 on the substrate 102. In one or more embodiments, the barrier layer 106 comprises a liner. In one or more embodiments, the first etch stop layer 110 is titanium nitride (TiN) and is etched in a SYM3® Etch chamber of Applied Materials, Inc. Santa Clara, Calif. In one or more embodiments, the source power in a range of about 300 W to about 1000 W, the bias power in is a range of about 50 W to about 300 W, the pressure is in a range of about 4 to about 15 mTorr, the electrostatic chuck temperature is in a range of about 30° C. to about 70° C., the gas flow of chlorine is in a range of about 30 sccm to about 250 sccm, the gas flow of methane is in a range of about 10 sccm to about 100 sccm, and the gas flow of nitrogen is in the range of about 30 to about 500 sccm. In one or more embodiments, the titanium nitride (TiN) etch process is etched by pulsing the bias and source power in a frequency range of about 1000 Hz to about 10000 Hz and a duty cycle range of about 15% to about 90%.

Figure 4:
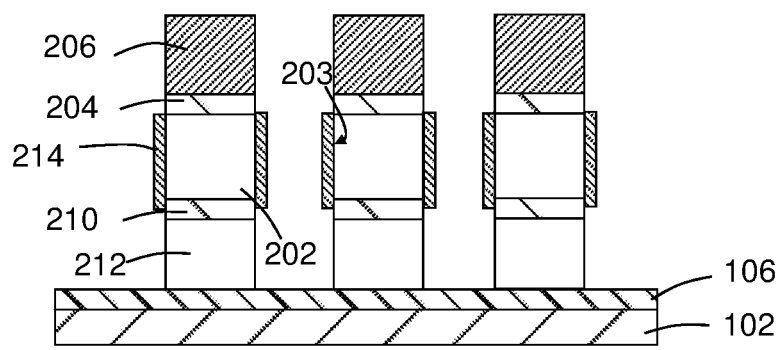
FIG. 4 illustrates a cross-section view of an interconnect structure according to one or more embodiments.

FIG. 4 illustrates a cross-section view of a structure according to one or more embodiments. Referring to FIG. 4, in one or more embodiments, the second metal layer 112 of the first conductive line 202 is passivated in the etch process of the first metal layer 108. Etching with passivation reduces erosion/necking of the sidewalls of first conductive lines 202 by a preventing an active species (e.g., radicals or energetic ions) from reacting with the first conductive lines 202. In one or more embodiments, the sidewalls 203 of first conductive lines 202 are passivated by utilizing a hard mask sputtering effect to sputter hard mask material 214 to the sidewall 203 of first conductive lines 202. In one or more embodiments, the sputtered hard mask material 214 is an oxide, e.g. silicon oxide, and the first metal layer 108 is ruthenium (Ru). In one or more embodiments, the hard mask sputtering effect is achieved by mixing a dilution gas (e.g., Ar, H2, He, N2) with an etching gas. In one or more embodiments, the hard mask sputtering effect is achieved by mixing a dilution gas (e.g., Ar, H2, He, N2) with an etching gas for ruthenium (Ru) etch. In one or more embodiments, a ruthenium (Ru) etch is performed in SYM3® Etch chamber of Applied Materials, Inc. Santa Clara, Calif. In one or more embodiments, the source power is in the range of about 300 W to about 1800 W, the bias power is in the range of about 50 W to about 300 W, the bias power pulsing duty cycle is in the range about 15% to about 90%, the pressure is in the range of about 4 mTorr to about 30 mTorr, the electrostatic chuck temperature is in the range of about 30° C. to about 90° C., the gas flow of oxygen is in the range of about 100 to about 700 sccm, and the gas flow of chlorine is in the range of about 20 to about 100 sccm. In one or more embodiments, the dilution gas is nitrogen ($N_2$) and is provided at a flow of 10 to 100 sccm.

Figure 5:
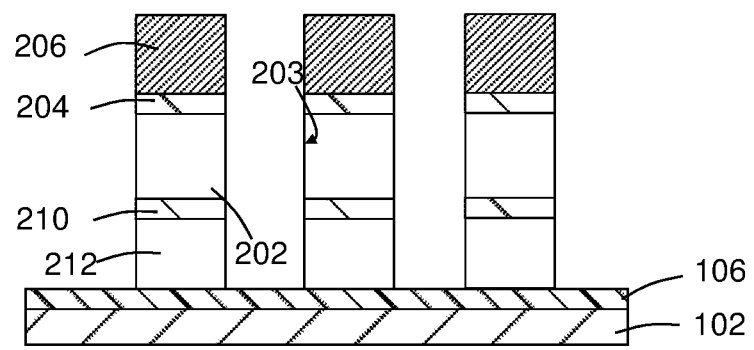
FIG. 5 illustrates a cross-section view of an interconnect structure according to one or more embodiments.

FIG. 5 illustrates a cross-section view of a structure according to one or more embodiments. Referring to FIG. 5, in one or more embodiments, the sputtered hard mask 214 on the sidewalls 203 of first conductive lines 202 is then removed by a wet or dry etch process. In some embodiments, the sputtered hard mask 214 comprises a metallic or dielectric mask material. Suitable dielectric materials include, but are not limited to, silicon oxide (SiO), silicon nitride (SiN), silicon carbide (SiC), aluminum oxide (AlOx), aluminum nitride (AlN) and combinations thereof. In one or more embodiments, the sputtered hardmask 214 comprises silicon oxide and is removed by a dilute hydrofluoric acid (DHF) clean. In one or more embodiments, DHF clean is performed in a dilution range of about 100:1 to about 2000:1 for a time range of about 10 seconds to about 10 minutes. In one or more embodiments, sputtering the sputtered hard mask 214 comprises adding a dilution gas to the etch gas. In one or more specific embodiments, the sputtered hard mask 214 comprises silicon oxide, the second conductive lines 212 comprise ruthenium (Ru), and the dilution gas comprises nitrogen ($N_2$).

In one or more embodiments, overlying the second conductive lines 212 formed from the first metal layer 108 are lines 210 of the first etch stop layer 110, first conductive lines 202, lines 204 of the second etch stop layer 114, lines 206 of hard mask layer 116. In one or more embodiments, the second conductive lines 212 are formed from a metal, and that metal is one which provides the effective resistivity dictated by the node size of the semiconductor structure. In one or more embodiments, trenches 208 separate rows of upwardly extending conductive lines 202, 212, which will be further processed to become conductive interconnect contacts.

FIG. 6 illustrates an isometric, three-dimensional view 400 of the partially patterned structure shown in FIG. 3 after filling of previously etched trenches 208 with a second BARC or spin-on dielectric material 124, which is used to support a subsequently applied photoresist 126. In one or more embodiments, the BARC (bottom Anti-reflective Coating) or the spin-on dielectric material 124 is formed from at least one polymer component, a crosslinking component, and an acid generator. In one or more embodiments, the BARC or spin-on dielectric material 124 is cured after application to the substrate surfaces, so that the precursor materials are able to penetrate into spaces having a minimal critical dimension. FIG. 6A illustrates a cross-section view 600A of the structure shown in FIG. 6. FIG. 6B illustrates a top view 600B of the structure illustrated in FIG. 6, including BARC or spin-on dielectric 124 filled trenches separating rows of material which will be further processed to become conductive interconnects.

In one or more embodiments, the combination of the bottom anti-reflective coating (BARC) or spin-on dielectric material 124, and the photoresist 126 are herein referred to the second "lithographic patterning structure."

FIG. 7 illustrates an isometric, three-dimensional view 700 of the partially patterned structure shown in FIG. 6 after etching of a series of spaces (trenches) 130 at an angle to previously etched trenches 128 (not shown, as they are filled with BARC or spin-on dielectric 124). In one or more embodiments, the BARC or spin-on dielectric layer 124, and the hard mask layer 116 have been etched down to the upper surface of the first conductive lines 202. FIG. 7A illustrates a cross-section view 700A of the structure shown in FIG. 7. FIG. 7B illustrates a top view 700B of the structure shown in FIG. 7.

Figure 8:
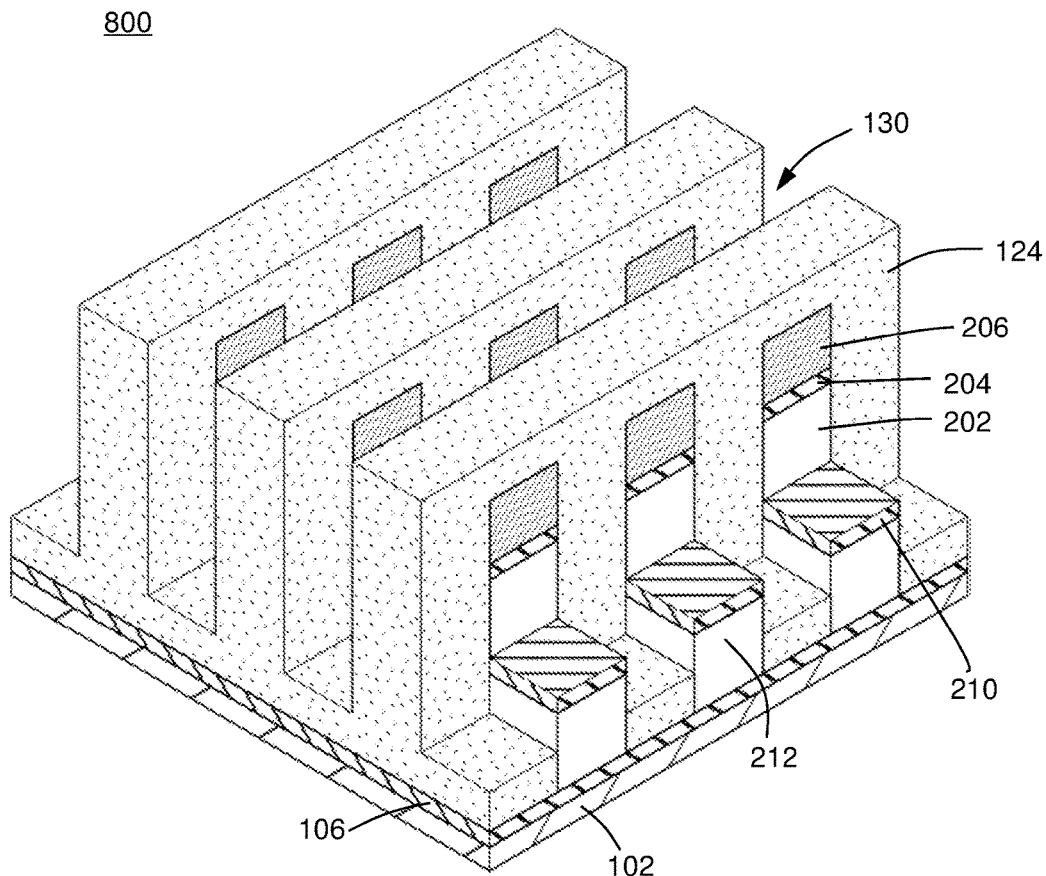
FIG. 8 illustrates an isometric view of an interconnect structure according to one or more embodiment of the disclosure.
Figure 8A:
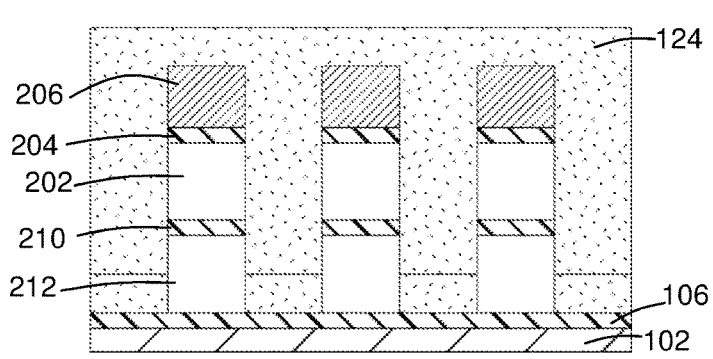
FIG. 8A illustrates a cross-section view of the interconnect structure of FIG. 8 according to one or more embodiments.
Figure 8B:
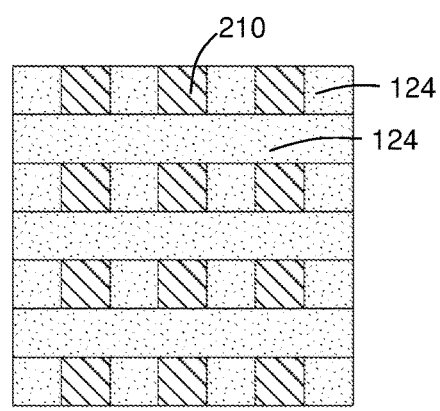
FIG. 8B illustrates a top view of the interconnect structure of FIG. 8 according to one or more embodiments.

FIG. 8 illustrates an isometric, three-dimensional view 800 of the partially patterned structure shown in FIG. 7 after etching of a series of spaces (trenches) 130 at an angle to the previously etched trenches 128 (not shown, as they are filled with BARC or spin-on dielectric 124). In one or more embodiments, the photoresist 126 has been removed, and the BARC or spin-on dielectric layer 124, and the conductive lines 202 have been etched to expose the upper surface of the lines of the first etch stop layer 210 to form a second partially patterned structure comprising the BARC or spin-on dielectric layer 124. FIG. 8A illustrates a cross-section view 800A of the structure shown in FIG. 8. FIG. 8B illustrates a top view 800B of the structure shown in FIG. 8.

FIG. 9 illustrates an isometric, three-dimensional view 900 of the partially patterned structure shown in FIG. 8, subsequent to the removal of the BARC or spin-on dielectric layer 124, typically by a dry etching process using an etchant plasma which does not affect layers 206, 204, 202, 210, 212, 106, and 102. After removing the second partially patterned structure (e.g., the BARC or spin-on dielectric layer 124), the structure shown in FIG. 9 is a self-aligned via comprising layers 206, 204, 202, 210, 212, 106, and 102. In one or more embodiments, the plasma etch process utilizes a mix of $H_2/N_2$ or $H_2/O_2$ and with or without any dilution gas (e.g., Ar, He). FIG. 9A illustrates shows a cross-section view 900A of the structure (e.g., the self-aligned via) shown in FIG. 9. FIG. 9B shows a top view 900B of the structure (e.g., the self-aligned via) shown in FIG. 9.

FIG. 10 illustrates an isometric, three-dimensional view 100 of the partially patterned structure shown in FIG. 9, subsequent to the removal of the first etch stop layer 210 and the barrier layer 106, typically by a dry etching process using an etchant plasma which does not affect layers 202, 210, 212, 106, and 102. In one or more embodiments, the plasma etch process utilizes a mix of H2/N2 or H2/O2 and with or without any dilution gas (e.g., Ar, He). Without intending to be bound by theory, it is thought that because the first etch stop layer 210 and the barrier layer 106 are conductive layers, they must be etched in the same pattern as the first metal layer 108 to prevent any line short. In one or more embodiments, the barrier layer 106 comprises a liner that must be etched. FIG. 10A illustrates shows a cross-section view 1000A of the structure shown in FIG. 10. FIG. 10B shows a top view 1000B of the structure shown in FIG. 10.

Figure 11:
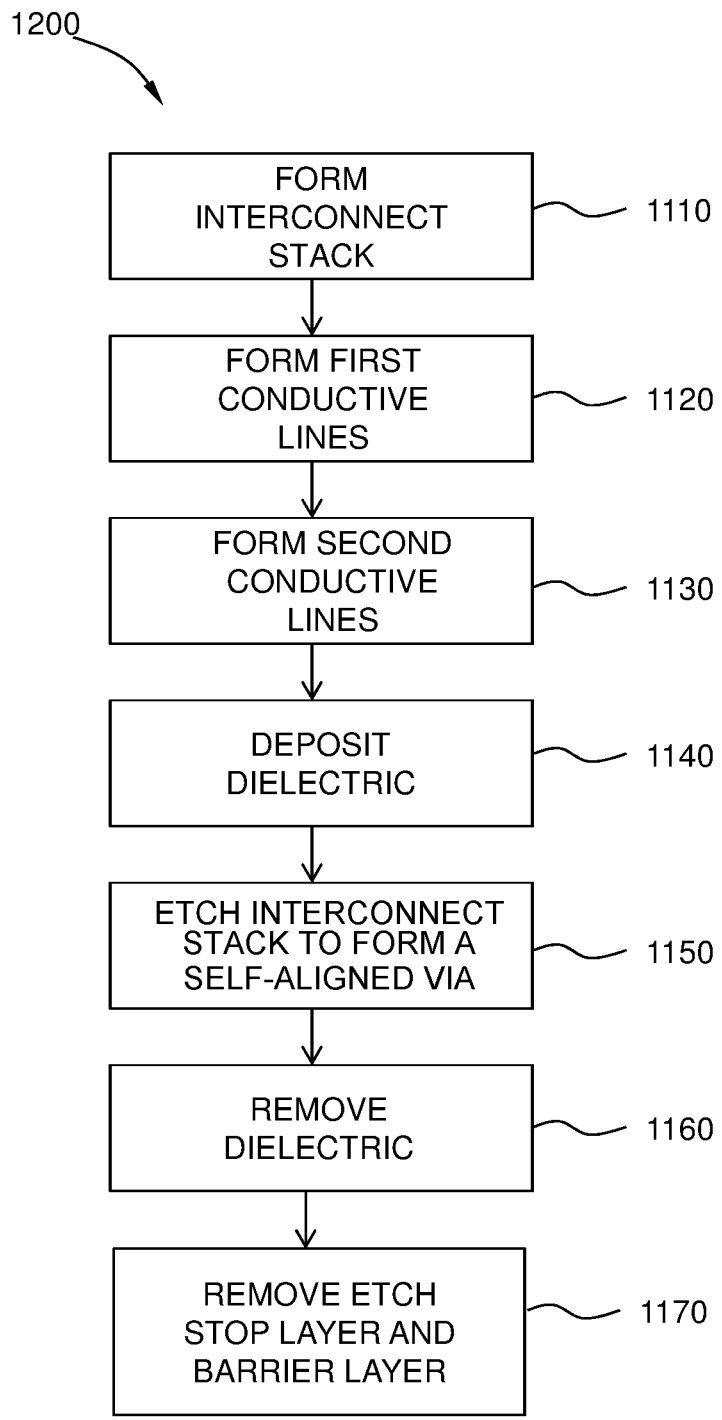
FIG. 11 depicts a flowchart of a method in accordance with one or more embodiments of the disclosure.

FIG. 11 illustrates a process flow diagram of a method 1100 according to one or more embodiments of the present disclosure. At operation 1110 an interconnect stack is formed. At operation 1120, first conductive lines are formed (e.g., by a subtractive etching process). At operation 1130, second conductive lines are formed (e.g., by a subtractive etching process). At operation 1140, a dielectric material (e.g., BARC or spin-on dielectric) is deposited. At operation 1150, the interconnect device is etched to form self-aligned vias. At operation 1160, the dielectric material is removed. At operation 1170, the first etch stop layer 210 and the barrier layer 106 are etched. In one or more embodiments, the barrier layer 106 comprises a liner that is etched.

In some embodiments, the deposition of the first etch stop layer 110 and the second metal layer 112 are performed in an integrated system. In one or more embodiments, the integrated system prevents oxidation of the first etch stop layer 110, which can increase resistivity of the first etch stop layer 110. In some embodiments, the deposition of the barrier layer 106 and the first metal layer 108 are performed in an integrated system. In one or more embodiments, the integrated system prevents oxidation of the barrier layer 106, which can increase resistivity of the barrier layer 106. In one or more embodiments, the barrier layer 106 comprises a liner, and the integrated system prevent oxidation of the liner, which can increase resistivity of the liner.

Thus, in one or more embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming an interconnect structure, the method comprising:
    forming a conformal first metal layer on a barrier layer on a substrate;
    forming a first etch stop layer on the first metal layer;
    forming a second metal layer on the first etch stop layer;
    forming a second etch stop layer on the second metal layer;
    forming a lithographic patterning structure over a top surface of the second etch stop layer;
    etching the lithographic patterning structure to form a first partially patterned structure having first conductive lines and to expose a top surface of the first etch stop layer;
    etching the first etch stop layer and the first metal layer of the partially patterned structure to form second conductive lines and expose a top surface of the barrier layer;
    forming a second lithographic patterning structure over a top surface of the first conductive lines and second conductive lines, the second lithographic patterning structure comprising a dielectric layer and a photoresist on the dielectric layer;
    etching the second lithographic patterning structure to remove the photoresist and expose an upper surface of the first conductive lines to form a second partially patterned structure comprising the dielectric layer, wherein the dielectric layer is etched to the upper surface of the first conductive lines;
    etching the second partially patterned structure to expose an upper surface of the first etch stop layer;
    removing the second partially patterned structure to form a self-aligned via; and
    etching the first etch stop layer and the barrier layer.

2. The method of claim 1, wherein the first metal layer and the second metal layer independently comprise one or more of tungsten (W), cobalt (Co), ruthenium (Ru), molybdenum (Mo), aluminum (Al), copper (Cu), or silicide.

3. The method of claim 1, wherein the first etch stop layer and the second etch stop layer independently comprise one or more of tantalum (Ta), tantalum nitride (TaN), titanium (Ti), titanium nitride (TiN), tungsten (W), cobalt (Co), ruthenium (Ru), niobium (Nb), or niobium nitride (NbN).

4. The method of claim 1, wherein the lithographic patterning structure comprises one or more of a hard mask layer, a first dielectric layer, or a patterned photoresist.

5. The method of claim 4, wherein the hard mask layer comprises one or more of silicon oxide (SiO), silicon nitride (SiN), silicon carbide (SiC), aluminum oxide (AlOx), or aluminum nitride (AlN), and the hard mask layer does not comprise silicon oxide (SiO) when the second metal layer comprises ruthenium (Ru).

6. The method of claim 4, wherein the first dielectric layer comprises one or more of a bottom anti-reflective coating (BARC) or a spin-on dielectric material.

7. The method of claim 1, wherein the dielectric layer is a second dielectric layer and comprises one or more of a bottom anti-reflective coating (BARC) or a spin-on dielectric material.

* * * * *